United States Patent
Dow et al.

(10) Patent No.: US 10,465,056 B2
(45) Date of Patent: Nov. 5, 2019

(54) METHOD FOR PRODUCING FLEXIBLE CONDUCTIVE SUBSTRATE WITH HIGH TRANSMITTANCE AND PRODUCT THEREOF

(71) Applicant: NATIONAL CHUNG HSING UNIVERSITY, Taichung (TW)

(72) Inventors: Wei-Ping Dow, Taichung (TW); Po-Ting Chen, Taichung (TW); Liang-Jie Lin, Taichung (TW); Hung-Ming Chang, Taichung (TW); Ting-Yun Lin, Taichung (TW); Fang-Yu Lin, Taichung (TW)

(73) Assignee: NATIONAL CHUNG HSING UNIVERSITY, Taichung (TW)

( * ) Notice: Subject to any disclaimer, the term of this patent is extended or adjusted under 35 U.S.C. 154(b) by 171 days.

(21) Appl. No.: 15/803,871

(22) Filed: Nov. 6, 2017

(65) Prior Publication Data
US 2018/0340050 A1    Nov. 29, 2018

(30) Foreign Application Priority Data
May 24, 2017    (TW) ................ 106117261

(51) Int. Cl.
| | | |
|---|---|---|
| *B23B 3/00* | (2006.01) | |
| *C08J 7/12* | (2006.01) | |
| *C23C 18/16* | (2006.01) | |
| *H01B 5/14* | (2006.01) | |
| *C23C 18/20* | (2006.01) | |
| *C23C 18/30* | (2006.01) | |
| *H01B 3/30* | (2006.01) | |
| *G03F 7/20* | (2006.01) | |
| *G03F 7/30* | (2006.01) | |

(Continued)

(52) U.S. Cl.
CPC ............. *C08J 7/12* (2013.01); *C08J 7/123* (2013.01); *C23C 18/1641* (2013.01); *C23C 18/1689* (2013.01); *C23C 18/204* (2013.01); *C23C 18/2086* (2013.01); *C23C 18/30* (2013.01); *H01B 5/14* (2013.01); *C08J 2323/06* (2013.01); *C08J 2327/06* (2013.01); *C08J 2367/02* (2013.01); *C08J 2369/00* (2013.01); *C08J 2379/08* (2013.01); *C23C 18/38* (2013.01); *C23F 1/00* (2013.01); *C23F 1/02* (2013.01); *G03F 7/20* (2013.01); *G03F 7/30* (2013.01); *H01B 3/306* (2013.01); *H01B 3/423* (2013.01); *H01B 3/441* (2013.01); *H01B 3/443* (2013.01)

(58) Field of Classification Search
CPC .. C08J 7/12; C08J 7/123; C23C 18/30; C23C 18/204; C23C 18/2086; C23C 18/1689
See application file for complete search history.

(56) References Cited

U.S. PATENT DOCUMENTS

| | | | |
|---|---|---|---|
| 8,663,485 B2 | 3/2014 | Hu et al. | |
| 2005/0218487 A1* | 10/2005 | Kimura | H01L 21/4846 257/676 |
| 2016/0186325 A1* | 6/2016 | Iwashita | H05K 1/032 174/250 |

* cited by examiner

*Primary Examiner* — Elizabeth E Mulvaney
(74) *Attorney, Agent, or Firm* — Pai Patent & Trademark Law Firm; Chao-Chang David Pai (57) ABSTRACT

The method for producing a transparent conductive substrate includes forming metal meshes on a flexible non-conductive substrate with high transmittance. It's unnecessary to use palladium as a catalyst in this method. The metal meshes are in the form of nano/micro wires and the conductive substrate has high transmittance of 80%-90% at visible light wavelengths of 390-750 nm.

19 Claims, 8 Drawing Sheets
(7 of 8 Drawing Sheet(s) Filed in Color)

(51) Int. Cl.
  *C23F 1/00*   (2006.01)
  *H01B 3/44*   (2006.01)
  *H01B 3/42*   (2006.01)
  *C23F 1/02*   (2006.01)
  *C23C 18/38*  (2006.01)

METHOD FOR PRODUCING FLEXIBLE CONDUCTIVE SUBSTRATE WITH HIGH TRANSMITTANCE AND PRODUCT THEREOF

CROSS-REFERENCE TO RELATED APPLICATIONS

The present application claims benefit of priority of the Taiwan Patent Application No. 106117261, filed May 24, 2017. The entirety of said Taiwan application is incorporated by reference herein.

STATEMENT REGARDING PRIOR DISCLOSURES BY THE INVENTOR

The subject matter of the present invention was previously disclosed by the Applicant in the Taichung Municipal/Private Primary and Secondary School Science Fair, held Apr. 11-16, 2017 in Taichung, Taiwan, and therefore is a grace period disclosure under 35 U.S.C. 102(b)(1)(A).

BACKGROUND OF THE INVENTION

1. Field of the Invention

The present invention relates to a method for forming metal meshes on a flexible non-conductive substrate with high transmittance, without using palladium as a catalyst. The present invention also relates to a flexible conductive substrate made by this method.

2. Related Prior Art

Transparent conductive films are now widely applied to monitors, lighting devices, solar cells, sensors and electrochromic devices. The indium tin oxide (ITO) conductive films fabricated with traditional coating processes possess good conductivity and transparency and therefore are suitable for optoelectronic devices. However, the ITO material is more and more expensive as the resource is rare. The specifications of raw material and equipments in the chemical deposition processes for fabricating the ITO films are critically required. In addition, the transparent ITO films are hard and could not be applied in flexible electrodes.

Currently, polymers such as PET are developed in manufacturing transparent conductive films as they are thin, light, sturdy, resilient, flexible, and easy to process and shape. An important technology is to convert the non-conductive surface of PET into conductive surface.

CN103124470B (U.S. Pat. No. 8,663,485) discloses a method of manufacturing plastic metallized 3D circuit. The method includes the steps of: (1) providing a 3D plastic main body; (2) performing a surface pretreatment on the plastic main body; (3) performing a metallization process on the plastic main body to deposit a thin metal film thereon; (4) performing a photoresist coating process to form a photoresist protective layer on the thin metal film; (5) performing an exposure and development process on the photoresist protective layer to form a patterned photoresist protective layer; (6) performing an etching process on the exposed thin metal film to form a patterned metal circuit layer; (7) stripping the patterned photoresist protective layer; and (8) performing a surface treatment on the patterned metal circuit layer to form a metal protective layer.

In the above step (2), the surface pretreatment includes surface degreasing, surface roughening, sensitization treatment and activation treatment. In the sensitization treatment, stannous chloride is mixed with stannous ions ($Sn^{2+}$) contained in an acid solution and then made to permeate into pores on the roughened surfaces of the plastic main body to thereby adsorb on the surfaces of the plastic main body. In the activation treatment, palladium chloride is mixed with palladium ions ($Pd^{2+}$) contained in an acid solution to form active metal particles in continuous implantation reaction, so as to facilitate subsequent formation of the metal film on the plastic main body through metal deposition. In the metallization process, a metal material is deposited on the surfaces of the plastic main body to form a thin film by low-temperature sputtering or plastic water plating. The metal material is nickel (Ni), cobalt (Co), palladium (Pd), tin (Sn), copper (Cu) or the composites thereof.

In the above method, expensive palladium serves as catalyst. However, palladium is difficult to remove and thus remains on the surface as gray residuals which significantly decrease transmittance of the product. One solution is to apply other expensive chemicals to remove undesired palladium though the transparency of PET is still not satisfactory.

Figure 1:
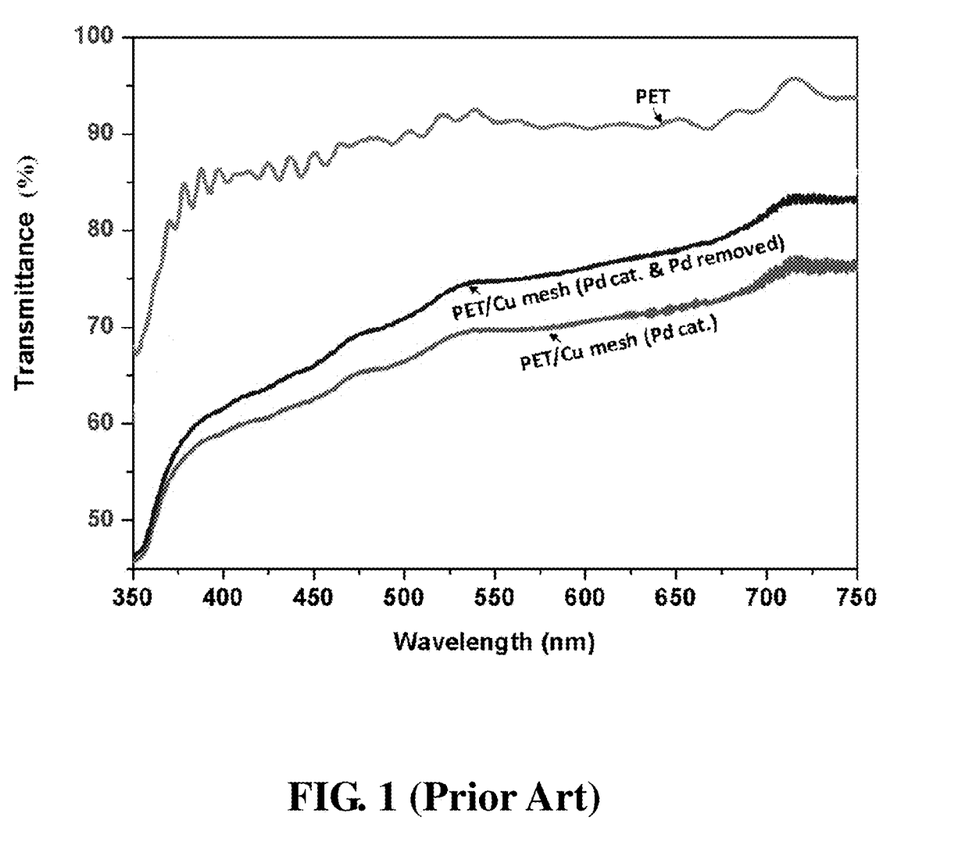
FIG. 1 shows transmittances of the pristine PET film, the PET films with copper meshes before and after palladium removal.

FIG. 1 shows transmittances of a pristine PET film, PET films with metal meshes before and after removing palladium. The transmittance of the pristine PET film ranges from 85% to 90% at wavelengths of 390-750 nm. After being metalized with palladium chloride, exposed, developed and etched, the surface of the PET film is modified with patterned metal meshes and the transmittance thereof decrease to 60%-70%. After palladium removal, the transmittance of the PET film increases to 65%-75% but are still lower than the requirements (above 80%) for a transparent conductive film.

Figure 2:
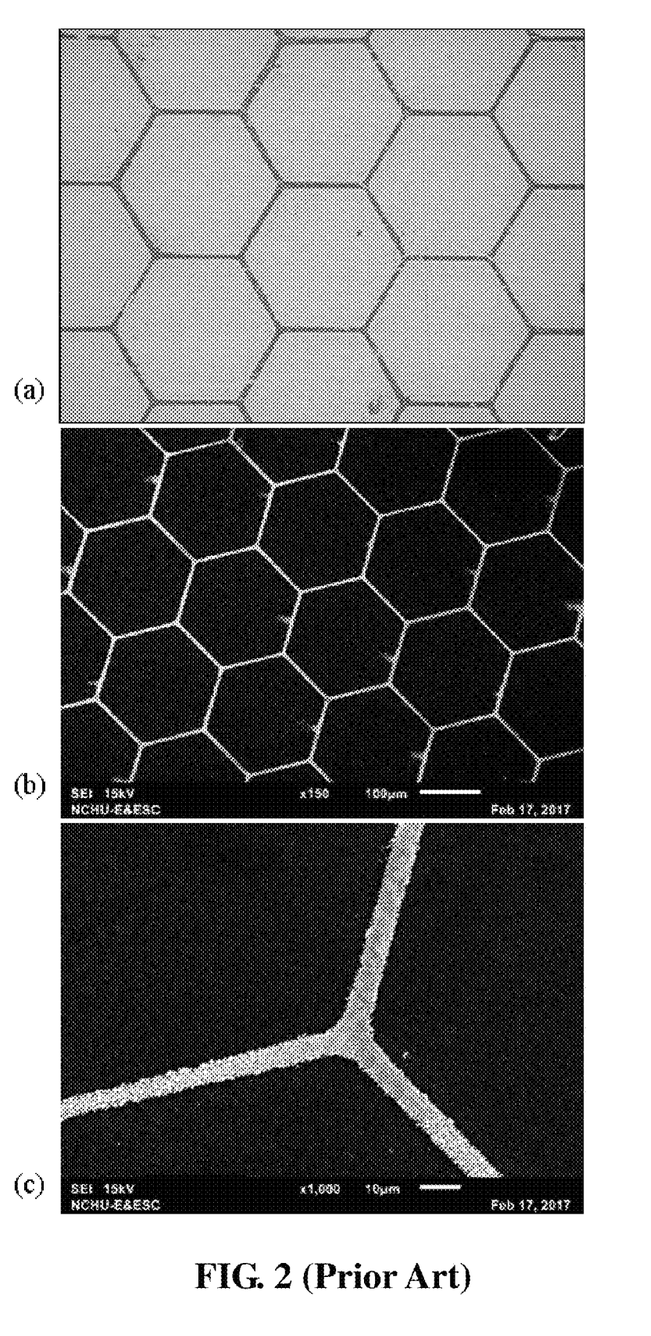
FIG. 2 shows images of the PET film with metal meshes before palladium removal, wherein (a) is the OM image, (b) and (c) are the SEM images of 150× and 1000×.

FIG. 2 shows images of the PET film with metal meshes before palladium removal, wherein (a) is the optical microscope (OM) image, (b) and (c) are the scanning electron microscope (SEM) images of 150× and 1000×.

Figure 3:
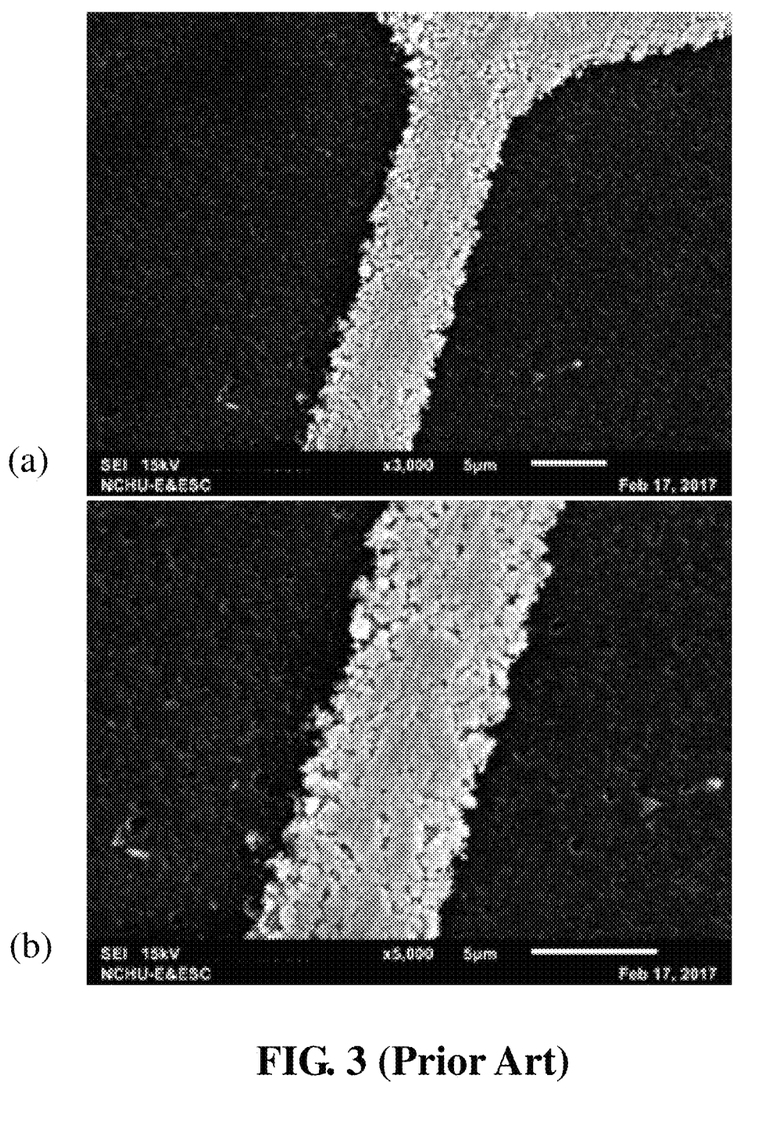
FIG. 3 shows SEM images of the PET film with metal meshes after palladium removal, wherein (a), (b), (c) and (d) are images of 150×, 1000×, 3000× and 5000×, respectively.

FIG. 3 shows SEM images of the PET film with metal meshes after palladium removal, wherein (a) and (b) are images of 3000× and 5000×, respectively. The metal meshes are damaged during the procedure of palladium removal and the conductivity of the PET film is reduced.

SUMMARY OF THE INVENTION

An object of the present invention is to provide a method for producing a flexible conductive substrate with high transmittance without using palladium as a catalyst.

Another object of the present invention is to provide a flexible conductive substrate with metal meshes in the form of nano/micro wires and transmittance of 80%-90% at visible light wavelengths of 390-750 nm.

The method of the present invention includes steps of: (A) providing a flexible non-conductive substrate with high transmittance; (B) oxidizing a surface of the substrate to form oxygen functional groups thereon; (C) bonding amino functional groups to the oxygen functional groups on the surface of the substrate to form a modification layer; (D) grafting a metal ion catalyst to the modification layer wherein the metal ion is selected from the group consisting of Ag, Cu, Ni and a composition thereof; (E) reducing the metal ions to metal atoms; (F) depositing a metal film on the surface of the substrate through an electroless plating process; and (G) transforming the metal film into nano/micro metal meshes by means of exposing, developing and etching, sequentially.

The flexible conductive substrate produced by the aforementioned method is covered with the metal meshes in an area ratio less than 20% and has a high transmittance ranging from 80% to 90% at visible light wavelengths of 390-750 nm. Each metal mesh has a diagonal of 250 μm-1000 μm, a width of 2 μm-12 μm and a thickness of 2 μm-12 μm.

Advantages of the present invention include:

The flexible substrate has a high transmittance after the conductive metal meshes are constructed on the surface thereof.

Palladium is not necessary and thus shortages thereof, for example, high cost, low transparency, damage in metal meshes during Pd removal and decreasing conductivity, can be avoided.

The metal film is well adhered to the substrate and is easy to process in the later patterning procedures. The undesired copper is easily removed in the etching procedure, so that high transmittance can be achieved. Since no expensive chemical for catalyst removal is necessary, the cost is lowered.

The organic and inorganic chemicals used in the process are generally acceptable in environment. The process can be completed within a shorter period than the wet electroless plating process using the Pd catalyst. Flexible transparent substrates with nano/micro metal meshes or circuits can be realized.

For the substrate of the present invention and the pristine PET film, the transmittances range respectively between 80-90% and 85%-90% at wavelengths 390-750 nm, and are respectively between 88-89% and 90-91% at the wavelength 550 nm. That is, the transmittance of the substrate with metal meshes approaches that of the pristine substrate and is higher than the current requirement (80%) for the transparent conductive film. Compared with the substrate treated with Pd catalyst, the transmittance of the substrate of the present invention is greatly promoted by about 20%.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION OF THE PREFERRED EMBODIMENTS

The method for producing a flexible conductive substrate with high transmittance according to the present invention will be described in detail by way of the examples presented below in conjunction with the accompanying figures.

Example 1

The method for producing a flexible conductive substrate with high transmittance includes steps of: (A) providing a flexible non-conductive substrate with high transmittance; (B) modifying a surface of the substrate to form oxygen functional groups on the surface; (C) bonding amino functional groups to the oxygen functional groups on the surface of the substrate to form a modification layer; (D) grafting a metal ion catalyst onto the modification layer; (E) reducing the metal ions to metal atoms; (F) depositing a metal film on the substrate by the electroless plating process; and (G) transforming the metal film into nano/micro metal meshes by means of exposure, development and etching, sequentially.

The flexible non-conductive substrate with high transmittance in step (A) can be polyethylene terephthalate (PET), polycarbonate (PC), polyvinyl chloride (PVC), polyethylene (PE) or transparent polyimide (PI). In a preferred embodiment of the present invention, the substrate is a composition of polyethylene terephthalate (PET) and silica. The substrate is cleaned with an organic solvent and a water solution and then dried in an oven.

In step (B), a surface of the substrate is oxidized to form oxygen functional groups thereon by means of UV irradiation or a chemical reaction with an acidic solution, a basic solution or an organic solvent. The acidic or basic solution can be a solution containing NaOH, KOH, $KMnO_4/NaOH$, $KMnO_4/HCl$, $KMnO_4/H_2SO_4$, $KOH/C_2H_5OH$ or $H_2SO_4/H_2O_2$. The organic solvent can be dimethylformamide (DMF), dimethylacetamide (DMAC), tetrahydrofuran (THF) or $(CH_2OH)_2$. The oxygen functional group on the substrate can be a ketone group, an ester group or an acid group. In a preferred embodiment, the substrate is dipped in a solution containing KOH at 25-60° C. for 1-30 minutes.

In step (C), the amino groups are bonded to the oxygen groups of the substrate by contacting the substrate with a solution containing aminosilane or a polymer with amino groups at pH 4-6 or pH 9-11. The substrate is preferably rinsed in the solution at 25-60° C. for 10-30 minutes. The amino groups of the aminosilane and the polymer can react with the oxygen groups of the substrate and are thus bonded thereon, whereby the surface of the substrate is converted to be conductive.

The aminosilane can be 3-aminopropyl trimethoxy silane, 3-aminopropyl triethoxy silane, 3-(dimethoxymethylsilyl) propylamine, 3-(diethoxymethylsilyl)propylamine, N-[3-(trimethoxysilyl)propyl]ethylenediamine, N-[3-(triethoxysilyl)propyl]ethylenediamine, 3-(2-Aminoethylamino)propyl-dimethoxymethylsilane, 3-(2-Aminoethylamino)propyl-diethoxymethylsilane, 3-divinyltriamine propytrimethoxysilane, 3-divinyltriamine propymethyl-dimethoxysilane, N-[3-(trimethoxysilyl)propyl]-N'-(vinyl-benzyl), N-butylaminopropyltrimethoxysilane, N-butylaminopropyltriethoxysilane, N-(3-(trimethoxysilyl)propyl) cyclohexanamine, bis(3-trimethoxysilylpropyl)amine, bis (3-triethoxysilylpropyl)amine, N-[3-(trimethoxysilyl)propyl]aniline, N-octyldimethyl (dimethylamino) silane or (N,N-diethyl-3-aminopropyl)trimethoxysilane. In a preferred embodiment of the present invention, (3-Aminopropyl)triethoxysilane is used.

The polymer with the amino groups has a structural formula (1)

(1)

wherein n=1-8, m=1-10, and $R_1$ can be triazole, imidazole, caprolactam, pyridine or pyrazine.

The pH regulator can be an organic or inorganic acid or an alkaline compound, for example, formic acid, acetic acid, hydrochloric acid, NaOH and KOH.

In step (C), a step of heat drying the substrate is carried out after the modification layer is formed so that the amino groups can be steadily bonded on the substrate. The substrate is preferably heated in an oven at 40-120° C. for 5-30 minutes.

In step (D), the metal ion catalyst grafted onto the modification layer can be Ag, Cu, Ni or a composition thereof. In a preferred embodiment, the metal ions are copper ions.

The substrate is dipped in a solution containing a chelating agent, copper ions, a pH regulator and deionized water at pH 4-10, 20-40° C. for 5-20 minutes and then rinsing the substrate in deionized water. Preferably, the chelating agent is a chemical with formula (3) or (4), the copper ions are provided by a soluble salt, and the pH regulator is selected from the group consisting of NaOH, KOH and $NH_4OH$.

(3)

wherein $R_1$ is selected from the group consisting of a polyalkyl group, a naphthenic group, an alkyl carboxyl acid and an alkyl amino acid; and
$R_2$ is selected from the group consisting of an enamino carboxyl group, an alky group, an amino carboxyl group, an amino group, a carboxyl group, a polyol and a ketone group.

(4)

wherein $R_1'$ is selected from the group consisting of a polyalkyl group, an enyl group, an amino group and a naphthenic group; and
$R_2'$ is selected from the group consisting of an amino group, a carboxyl group, an alcohol and a polyol.

In step (E), the copper ions are reduced to nano copper atoms by dipping the substrate in a solution containing a reducing agent at a concentration of 0.01-0.5M, pH 7-10 and 20-80° C. for 1-10 minutes and then rinsing the substrate in deionized water. The reducing agent can be dimethylaminoborane (DMAB), hydrazine ($N_2H_4$), $NaPO_2H_2$, $NaBH_4$, or a mixture thereof.

After grafting the copper ions in step (D) and reducing them in step (E), the surface of the substrate is covered with nano copper which has high catalyst activity.

The electroless plating process of step (F) can be a general process known by one skilled in this art. The chemical copper plating solution is usually controlled at 20-60° C., preferably at 25-40° C., and can be agitated by air, fast flow or blades. Compositions of the plating solution can be those well known, and usually contain a soluble copper salt, a chelating agent, a pH regulator, a reducing agent and additives.

In step (G), the procedures including exposing, developing and etching.

Figure 4:
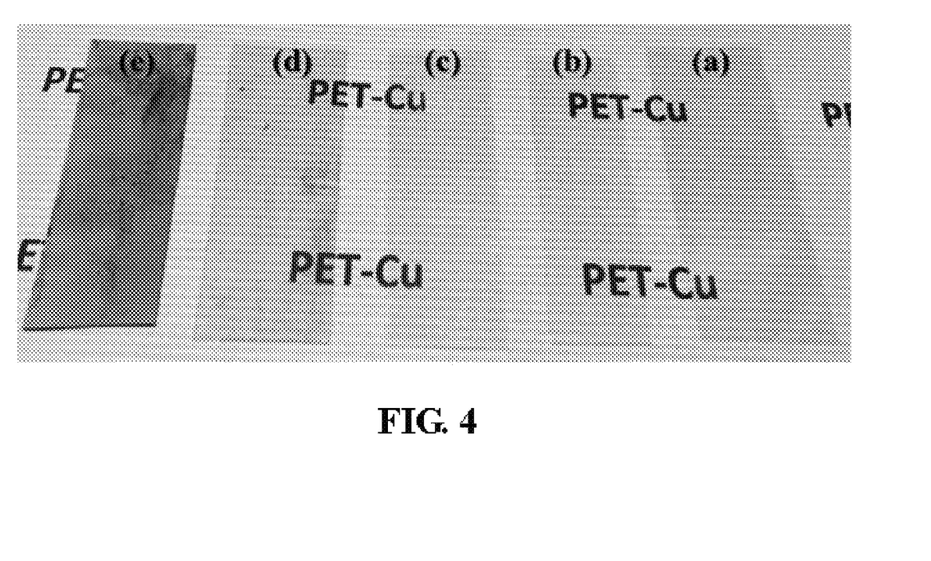
FIG. 4 shows the substrate of the present invention during various steps of the manufacturing process.

FIG. 4 shows the substrate during the manufacturing process wherein (a) shows the substrate with the oxygen groups after step (B), (b) shows the substrate modified with the amino groups after step (C), (c) shows the substrate with the copper ions grafted in step (D), (d) shows the gray nano copper reduced in step (E) and (e) shows the metal film formed on the substrate by electroless plating in step (F).

Figure 5:
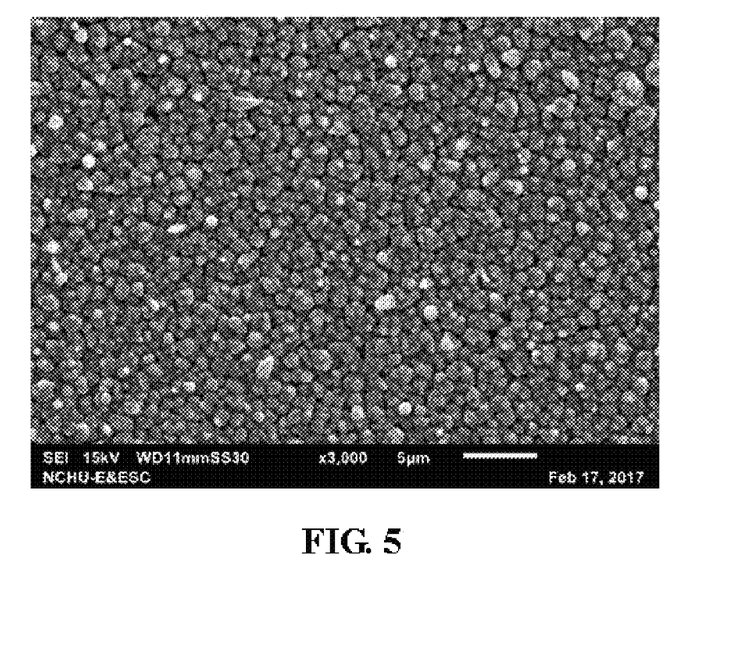
FIG. 5 shows the SEM (3000×) image of the metal film which is uniformly coated on the substrate.

FIG. 5 shows the SEM (3000×) image of the metal film which is uniformly coated on the substrate.

Figure 6:
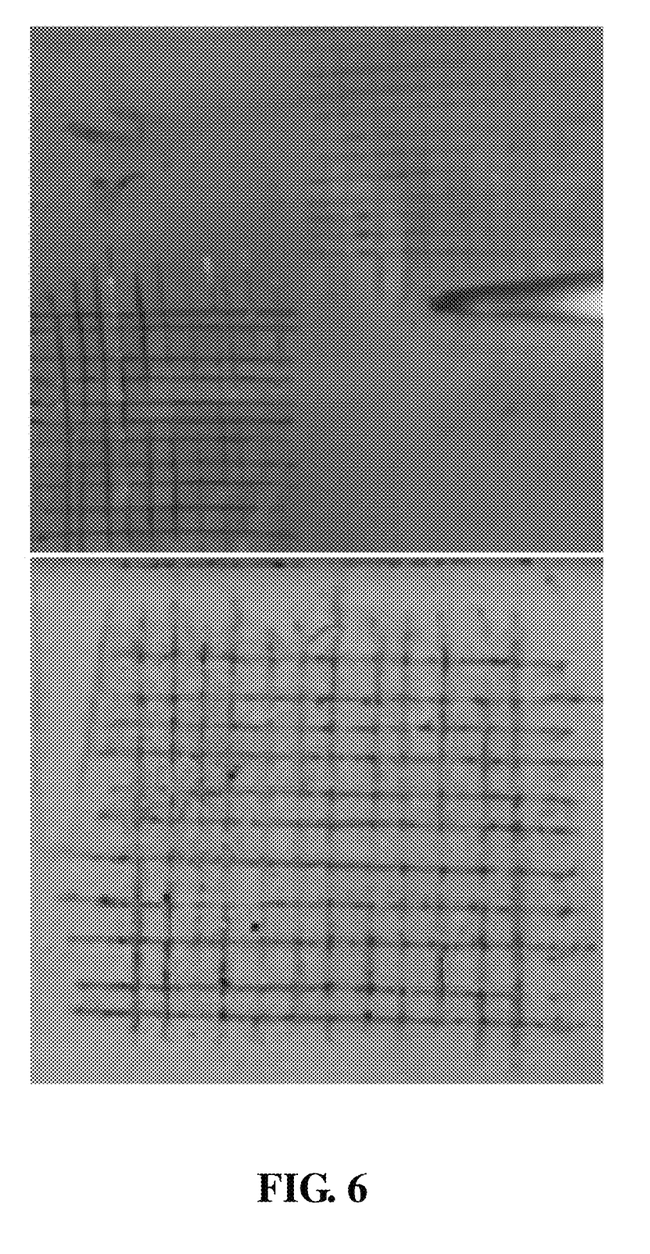
FIG. 6 shows the substrate for the cross-cut tape test.

FIG. 6 shows the substrate for the cross-cut tape test. The upper portion shows the copper film after cross cutting and the lower portion shows the tape without copper adhered thereto.

Figure 7:
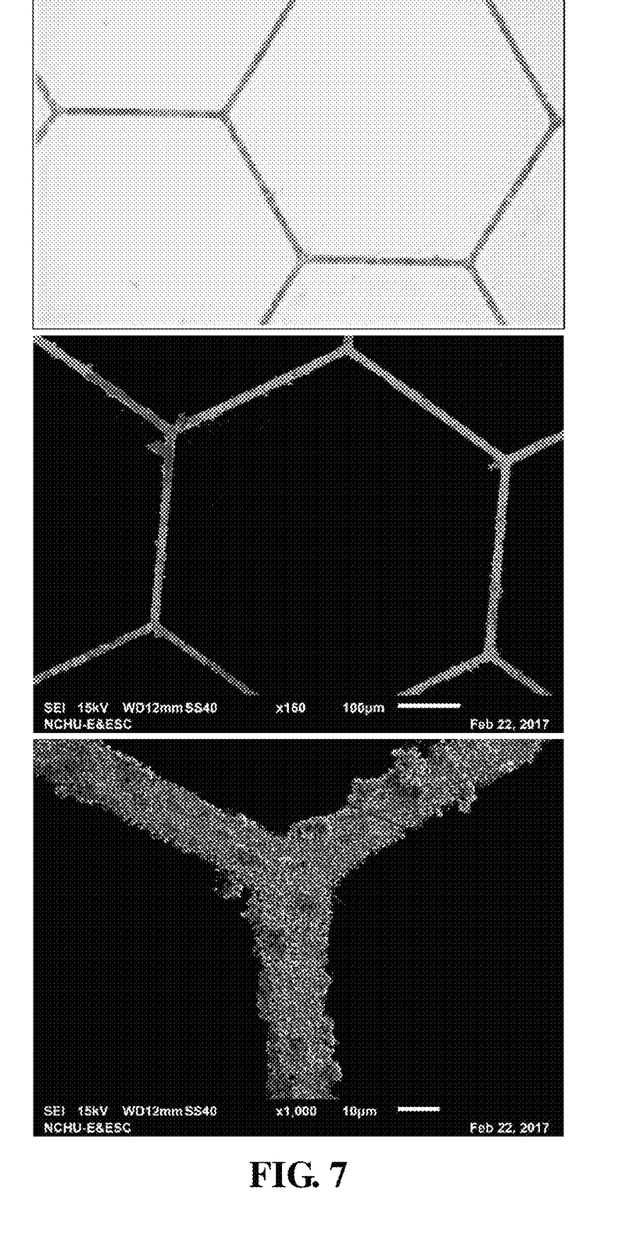
FIG. 7 shows the substrate with metal meshes wherein (a) is the OM image, (b) and (c) are the images of SEM (150×) and SEM (1000×).

FIG. 7 shows the substrate with metal meshes wherein (a) is the OM image, (b) and (c) are the images of SEM (150×) and SEM (1000×). The metal meshes interconnect over the substrate in an area ratio less than 20% (projected area of the metal meshes/PET area). Each metal mesh has a diagonal of 250 μm-1000 μm, a width of 2 μm-12 μm and a thickness of 2 μm-12 μm, and preferably has a diagonal of 600 μm, a width of 10 μm and a thickness of 3 μm.

Figure 8:
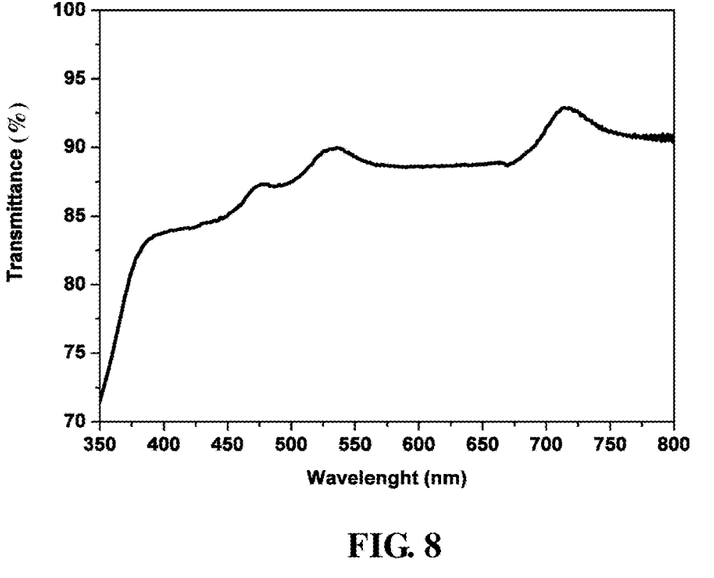
FIG. 8 shows the transmittance of the substrate treated with the KOH solution in step (B).

FIG. 8 shows the transmittances of the substrate treated with the KOH solution in step (B). For the substrates after and before being treated, the transmittances range respectively between 82-92% and 85%-90% (as shown in FIG. 1) at wavelengths 390-750 nm, and are almost the same at 90% at the wavelength 550 nm (most sensitive to human eyes). The results indicate that the treatment of step (B) does not decrease transmittance of the substrate.

Figure 9:
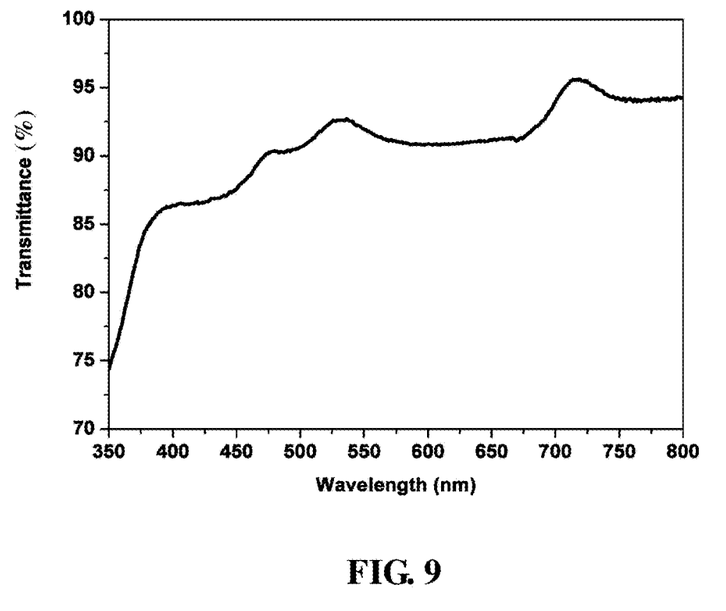
FIG. 9 shows the transmittance of the substrate treated with the aminosilane solution in step (C).

FIG. 9 shows the transmittance of the substrate treated with the aminosilane solution in step (C). For the substrate after and before being treated, the transmittances range respectively between 85-95% and 85%-90% (as shown in FIG. 1) at wavelength 390-750 nm, and are respectively between 92-94% and 90% at the wavelength 550 nm. The results indicate that the oxygen groups formed in step (C) does not decrease the transmittance of the substrate.

Figure 10:
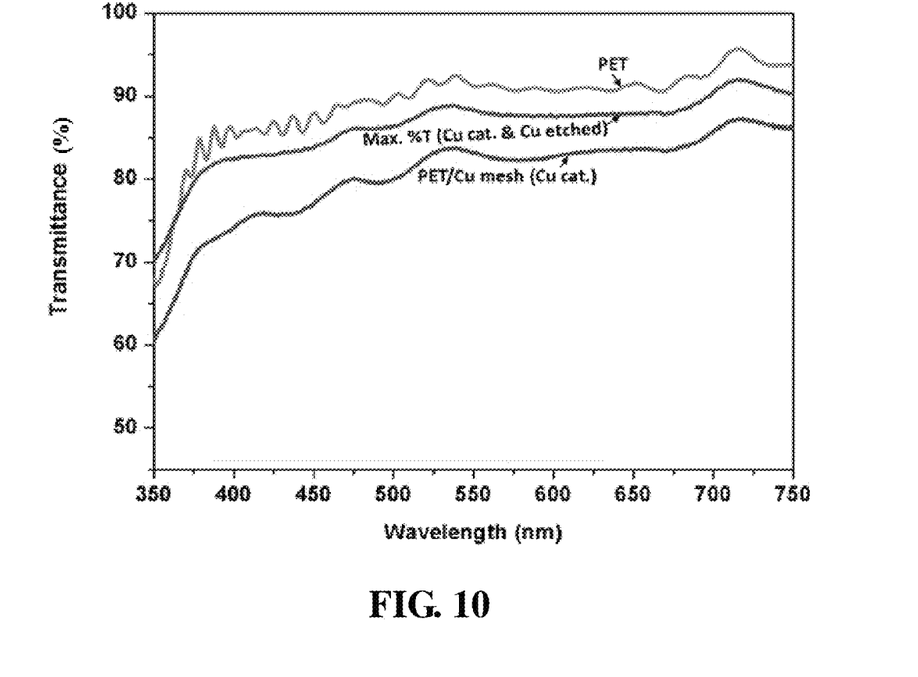
FIG. 10 shows the transmittance of the substrate after etching undesired copper.

FIG. 10 shows the transmittance of the substrate after the undesired cupper film is etched. For the substrates after and before being treated, the transmittances range respectively between 80-90% and 85%-90% (as shown in FIG. 1) at wavelength 390-750 nm, and range respectively between 88-89% and 90-91% at the wavelength 550 nm.

Since the copper film is etched clearly, the transmittances of the substrate with metal meshes approaches that of the pristine substrate and is higher than the current requirement (80%) for the transparent conductive film. Compared with the substrate treated with Pd catalyst, the transmittance of the substrate of the present invention is greatly promoted by about 20%.

That is, the procedures in steps (B)-(E) are significant improvements in keeping high transmittance of the flexible conductive substrate.

Figure 11:
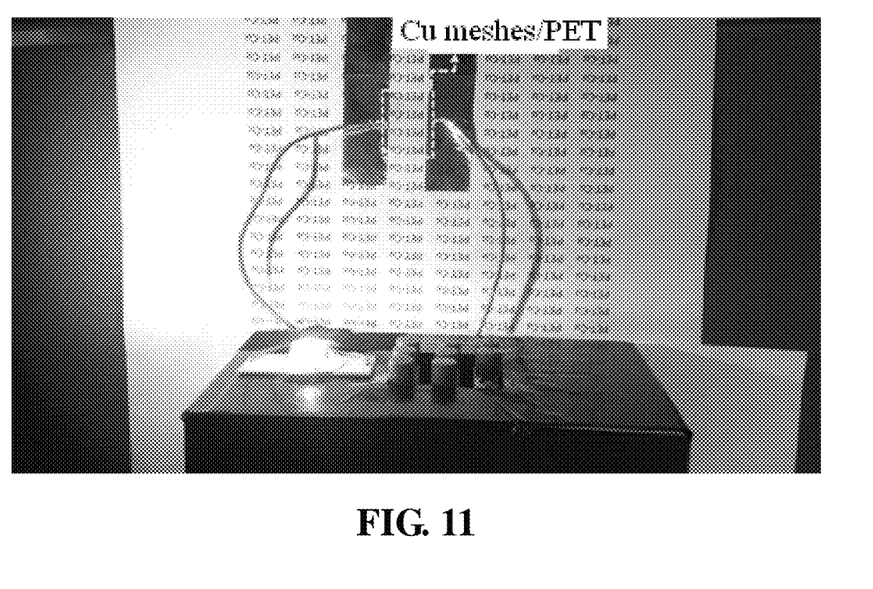
FIG. 11 shows the LED lit through the conductive substrate of this invention.

FIG. 11 shows the LED lit through the conductive substrate of this invention which is verified to be an excellent flexible transparent electrode.

What is claimed is:

1. A method for producing a flexible conductive substrate with high transmittance, comprising steps of:
   (A) providing a transparent flexible non-conductive substrate;
   (B) oxidizing a surface of the substrate to form oxygen functional groups thereon;
   (C) bonding amino functional groups to the oxygen functional groups on the surface of the substrate to form a modification layer;
   (D) grafting a metal ion to the modification layer wherein the metal ion is selected from the group consisting of Ag, Cu, Ni, and a composition thereof;
   (E) reducing the metal ions to metal atoms;
   (F) depositing a metal film on the surface of the substrate through an electroless plating process; and
   (G) transforming the metal film into nano/micro metal meshes by means of exposure, development and etching, sequentially.

2. The method of claim 1, wherein the flexible non-conductive substrate with high transmittance is selected from the group consisting of polyethylene terephthalate (PET), polycarbonate (PC), polyvinyl chloride (PVC), polyethylene (PE) and transparent polyimide (PI).

3. The method of claim 1, wherein the flexible non-conductive substrate with high transmittance is a composition of polyethylene terephthalate (PET) and silica.

4. The method of claim 1, wherein the surface of the substrate is modified to form oxygen functional groups on the surface in step (B) by means of UV irradiation or a chemical reaction with an acidic solution, a basic solution or an organic solvent.

5. The method of claim 1, wherein the surface of the substrate is modified in step (B) by means of immersing the substrate in a KOH solution.

6. The method of claim 5, wherein the substrate is immersed in the KOH solution at 25-60° C. for 1-30 minutes in step (B).

7. The method of claim 1, further comprising a step of drying the substrate by heat after the modification layer is formed in step (C) so as to steadily bond the amino groups on the substrate.

8. The method of claim 7, wherein the substrate is heated in an oven at 40-120° C. for 5-30 minutes in the step of drying the substrate.

9. The method of claim 1, wherein the amino groups are bonded to the substrate in step (C) by contacting the substrate with a solution containing aminosilane at pH4-6 or pH9-11.

10. The method of claim 9, wherein the substrate is rinsed in the solution containing aminosilane for 10-30 minutes.

11. The method of claim 9, wherein the aminosilane is selected from the group consisting of 3-aminopropyl trimethoxy silane, 3-aminopropyl triethoxy silane, 3-(dimethoxymethylsilyl)propylamine, 3-(diethoxymethylsilyl)propylamine, N-[3-(trimethoxysilyl)propyl]ethylenediamine, N-[3-(triethoxysilyl)propyl]ethylenediamine, 3-(2-Aminoethylamino)propyl-dimethoxymethylsilane, 3-(2-Aminoethylamino)propyl-diethoxymethylsilane, 3-divinyltriamine propyltrimethoxysilane, 3-divinyltriamine propymethyldimethoxysilane, N-[3-(trimethoxysilyl)propyl]-N'-(vinylbenzyl), N-butylaminopropyltrimethoxysilane, N-butylaminopropyltriethoxysilane, N-(3-(trimethoxysilyl)propyl) cyclohexanamine, bis(3-trimethoxysilylpropyl)amine, bis(3-triethoxysilylpropyl)amine, N-[3-(trimethoxysilyl) propyl]aniline, N-octyldimethyl (dimethylamino) silane and (N,N-diethyl-3-aminopropyl)trimethoxysilane.

12. The method of claim 1, wherein the amino groups are bonded to the substrate in step (C) by contacting the substrate with a solution containing a polymer with amino groups at pH 4-6 or pH 9-11.

13. The method of claim 12, wherein the substrate is dipped in the solution containing the polymer with amino groups for 10-30 minutes.

14. The method of claim 12, wherein the polymer with the amino groups has a structural formula (1)

wherein n=1-8, m=1-10, and $R_1$ is selected from the group consisting of triazole, imidazole, caprolactam, pyridine and pyrazine.

15. The method of claim 1, wherein the metal ion catalyst of step (D) comprises copper ions.

16. The method of claim 15, wherein the copper ions are grafted onto the modification layer of the substrate in step (D) by dipping the substrate in a solution containing a chelating agent, copper ions, a pH regulator and deionized water at pH 4-10 and 20-40° C. for 5-20 minutes and then rinsing the substrate in deionized water; wherein the chelating agent has a formula (3) or (4), the copper ions are supplied by a soluble salt, and the pH regulator is selected from the group consisting of NaOH, KOH and $NH_4OH$;

wherein $R_1$ is selected from the group consisting of a polyalkyl group, a naphthenic group, an alkyl carboxyl acid and an alkyl amino acid; and
$R_2$ is selected from the group consisting of an enamino carboxyl group, an alky group, an amino carboxyl group, an amino group, a carboxyl group, a polyol and a ketone group;

wherein $R_1'$ is selected from the group consisting of a polyalkyl group, an enyl group, an amino group and a naphthenic group; and
$R_2'$ is selected from the group consisting of an amino group, a carboxyl group, an alcohol and a polyol.

17. The method of claim 16, wherein the copper ions are reduced to nano copper atoms in step (E) by dipping the substrate in a solution containing a reducing agent with a concentration of 0.01-0.5M at pH 7-10 and 20-80° C. for 1-10 minutes and then rinsing the substrate in deionized water; wherein the reducing agent is selected from the group consisting of dimethylaminoborane (DMAB), hydrazine ($N_2H_4$), $NaPO_2H_2$, $NaBH_4$ and a mixture thereof.

18. A flexible conductive substrate made by the method of claim 1, wherein the metal meshes in the flexible conductive substrate has an area ratio less than 20% and the flexible conductive substrate has a transmittance of 80%-90% at visible light wavelengths of 390-750 nm, wherein each of the metal meshes has a diagonal of 250 μm-1000 μm, a width of 2 μm-12 μm and a thickness of 2 μm-12 μm.

19. The flexible conductive substrate of claim 18, wherein the flexible non-conductive substrate with high transmittance is selected from the group consisting of polyethylene terephthalate (PET), polycarbonate (PC), polyvinyl chloride (PVC), polyethylene (PE) and transparent polyimide (PI).

* * * * *